United States Patent
Cho et al.

(10) Patent No.: US 11,005,004 B2
(45) Date of Patent: May 11, 2021

(54) MICRO LIGHT EMITTING DIODE (LED) STRUCTURE, METHOD FOR MANUFACTURING THE SAME AND DISPLAY INCLUDING THE SAME

(71) Applicant: Korea Advanced Institute of Science and Technology, Daejeon (KR)

(72) Inventors: Yong-Hoon Cho, Daejeon (KR); Youngchul Sim, Daejeon (KR); Kie Young Woo, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/158,783

(22) Filed: Oct. 12, 2018

(65) Prior Publication Data

US 2019/0123235 A1    Apr. 25, 2019

(30) Foreign Application Priority Data

Oct. 20, 2017   (KR) .................. 10-2017-0136637
Sep. 21, 2018   (KR) .................. 10-2018-0113806

(51) Int. Cl.
*H01L 33/00*       (2010.01)
*H01L 33/32*       (2010.01)
(Continued)

(52) U.S. Cl.
CPC ........ *H01L 33/0075* (2013.01); *H01L 27/156* (2013.01); *H01L 33/24* (2013.01);
(Continued)

(58) Field of Classification Search
CPC ....... H01L 2924/00014; H01L 2924/00; H01L 2224/48091; H01L 2224/73265;
(Continued)

(56) References Cited

U.S. PATENT DOCUMENTS 9,748,437 B2    8/2017  Ohlsson et al.

FOREIGN PATENT DOCUMENTS

EP    2 357 676 A1   8/2011
JP    2004119964 A   4/2004
(Continued)

OTHER PUBLICATIONS

Seung-Hyuk Lim, Young-Ho Ko, Christophe Rodriguez, Su-Hyun Gong & Yong-Hoon Cho, Electrically Driven Quantum Dot/Wire/Well Hybrid Light-Emitting Diodes, Light: Science & Applications 5, e16030, Feb. 12, 2016, 21 pages.
(Continued)

*Primary Examiner* — Tony Tran
(74) *Attorney, Agent, or Firm* — Daly, Crowley, Mofford & Durkee, LLP

(57) ABSTRACT

Provided is a micro light emitting diode (LED) structure including an n-type semiconductor substrate layer, a light emitting structure layer formed on the n-type semiconductor substrate layer, and a p-type semiconductor layer formed on the light emitting structure layer, wherein the light emitting structure layer includes an arrangement of light emitting structures in which active layers including In and Ga are formed on tops thereof, wherein the light emitting structure layer forms at least three distinctive regions each including a single light emitting structure or a plurality of light emitting structures, the distinctive regions configured to emit light of at least two different wavelengths, the distinctive regions are controllable to emit light individually, and the distinctive regions are different in at least one of sizes of base faces, heights, and center-to-center distances of the lighting emitting structures of the regions.

10 Claims, 11 Drawing Sheets

(51) Int. Cl.
  *H01L 33/24* (2010.01)
  *H01L 27/15* (2006.01)
  *H01L 33/36* (2010.01)

(52) U.S. Cl.
  CPC .............. *H01L 33/32* (2013.01); *H01L 33/36* (2013.01); *H01L 33/007* (2013.01); *H01L 2933/0016* (2013.01)

(58) Field of Classification Search
  CPC . H01L 33/62; H01L 33/24; H01L 2924/1301; H01L 51/0061; H01L 51/0067; H01L 51/0072
  See application file for complete search history.

(56) References Cited

FOREIGN PATENT DOCUMENTS

| JP | 3906654 | B2 | 4/2007 |
|---|---|---|---|
| JP | 5211352 | B2 | 6/2013 |
| KR | 100826422 | B1 | 4/2008 |
| KR | 20120028104 | A | 3/2012 |
| KR | 20120067752 | A | 6/2012 |
| KR | 101322927 | B1 | 10/2013 |
| KR | 20170004420 | A | 1/2017 |

OTHER PUBLICATIONS

Young-Ho Ko, Jie Song, Benjamin Leung, Jung Han & Yong-Hoon Cho, Multi-color broadband visible light source via GaN hexagonal annular structure, Scientific Reports 4, Article No. 5514, Jul. 1, 2014, 19 pages.

Young-Ho Ko, Je-Hyung Kim, Su-Hyun Gong, Joosung Kim, Taek Kim, Yong-Hoon Cho, Red Emission of InGaN/GaN Double Heterostructures on GaN Nanopyramid Structures, ACS Photonics, Jan. 2015, 2 (4), 4 pages.

Young-Ho Ko, Je-Hyung Kim, Li-Hua Jin, Suk-Min Ko, Bong-Joon Kwon, Joosung Kim, Taek Kim, Yong-Hoon Cho, Electrically driven, phosphor-free, white light-emitting diodes using gallium nitride-based double concentric truncated pyramid structures, Advanced Materials, vol. 23, Issue 45, Oct. 17, 2011, 2 pages.

MICRO LIGHT EMITTING DIODE (LED) STRUCTURE, METHOD FOR MANUFACTURING THE SAME AND DISPLAY INCLUDING THE SAME

CROSS-REFERENCE TO RELATED APPLICATION(S)

This application claims the priority benefit of Korean Patent Application No. 10-2017-0136637 filed on Oct. 20, 2017, and Korean Patent Application No. 10-2018-0113806 filed on Sep. 21, 2018, in the Korean Intellectual Property Office, the disclosures of which are incorporated herein by reference for all purposes.

BACKGROUND

1. Field

One or more example embodiments relate to a micro light emitting diode (LED) structure and a method for manufacturing the same.

2. Description of Related Art

With the recent popularity of small-sized electronic devices such as augmented reality (AR), virtual reality (VR), and wearable devices, the development of micro displays draws attentions. Existing commercialized micro displays include a liquid crystal on silicon SI (LCoS) and organic light emitting diodes (OLED).

The LCoS implements a high-resolution display on a small-sized chip through high-density integration by applying the existing liquid crystal display (LCD) technology to a Si substrate. An LCD based display essentially needs a backlight and thus, has a limitation in thickness reduction and requires various complex processes such as polarizing film and color filer deposition.

A display using a light source autonomously emitting light solves the above issue. For example, an OLED based display implements a display using substances emitting red, blue, and green lights, thereby implementing a relatively thin display. Many OLED displays are applied to displays for outdoor devices. However, the OLED displays uses organic materials which are vulnerable to an outdoor environment.

To solve the issues of the structured mentioned above, displays using an LED which is an inorganic semiconductor light emitting device have been suggested. Micro LEDs developed thus far have the following issues for commercialization. Each LED structure being a subpixel needs to emit red, green, and blue lights to implement a display. However, an existing LED may implement only one color when a light emitting layer is formed on a single substrate. Thus, a process of transferring LED structures emitting light of respective colors on the substrate of the display is to be performed additionally. Since a transferring process requires a minute and precise process, the difficulty level of a process of manufacturing a display may increase and the yield may decrease, and thus commercialization may be difficult and there may be a limitation to implement a good quality full color display.

SUMMARY

An aspect provides a micro light emitting diode (LED) structure including distinctive regions controllable to emit light individually and having different wavelengths by forming three-dimensional (3D) light emitting structures to be grown concurrently on a single substrate.

Another aspect also provides a micro LED display including a micro LED structure, the micro LED display capable of emitting light of at least two of red (R), green (G), and blue (B) colors separately or concurrently.

Still another aspect also provides a method for manufacturing a micro LED structure.

The technical task which is intended to be achieved herein is not limited to the foregoing, and the other technical tasks which are not mentioned should also be clearly understandable by those skilled in the art from the following description.

According to an aspect, there is provided a micro LED structure including an n-type semiconductor substrate layer, a light emitting structure layer formed on the n-type semiconductor substrate layer, and a p-type semiconductor layer formed on the light emitting structure layer, wherein the light emitting structure layer may include an arrangement of light emitting structures in which active layers including In and Ga are formed on tops thereof, wherein the light emitting structure layer may form at least three distinctive regions each including a single light emitting structure or a plurality of light emitting structures, the distinctive regions configured to emit light of at least two different wavelengths, the distinctive regions may be electrically controllable to emit light individually, and the distinctive regions may be different in at least one of sizes of base faces, heights, and center-to-center distances of the lighting emitting structures of the regions.

A light emitting structure of a region configured to emit light of a relatively long wavelength may have a relatively great height.

Light emitting structures of a region configured to emit light of a relatively long wavelength may have a relatively great center-to-center distance between structures.

The distinctive regions may be different in In-migration levels in the active layers, wherein the distinctive regions may form a first region, a second region, and a third region, and the In-migration levels in the active layers on the light emitting structures of the first region, the second region, and the third region may be expressed as the first region > the second region > the third region.

The distinctive regions may be different in Ga to In average concentration ratios in the active layers, and a region configured to emit light of a relatively long wavelength may have a relatively great In to Ga average concentration ratio.

The distinctive regions may be individually connected to an electrode.

A region of a relatively long wavelength may have a relatively great average thickness of the active layers.

The light emitting structures of the distinctive regions may be different in at least one of heights, shapes, and areas and are all grown concurrently through a one-step process.

The distinctive regions may have center-to-center distances of the light emitting structures in the range of 50 nanometers (µm) to 100 micrometers (µm).

The distinctive regions may have heights of the light emitting structures in the range of 50 µm to 50 µkm.

The distinctive regions may form at least three regions having at least two different wavelengths, wherein the light emitting structures may include at least one of a cone, a polygonal pyramid, a cylinder; a polygonal prism, a circular ring, a polygonal ring, a hemisphere, a cone, a polygonal pyramid, a circular ring, and a polygonal ring truncated to have flat tops, a cone, a polygonal pyramid, and a polygonal prism including cylindrical hollows, and a line-shape wall.

The active layers may further include at least one of BAlGaN, GaAlNP, GaAlNAs, InAlGaN, GaAlNSb, GaInNP, GaInNAs, and GahNSb.

The active layers may further include super lattice layers.

According to another aspect, there is provided a color micro LED display including a micro LED structure.

According to still another aspect, there is provided a method for manufacturing a micro LED, the method including forming an n-type semiconductor layer on a bottom substrate, forming a mask layer on the n-type semiconductor layer, patterning the mask layer to form at least three distinctive regions each including a single opening pattern or a plurality of opening patterns, the distinctive regions being different in at least one of center-to-center distances and sizes of the opening patterns, growing a light emitting structure layer including at least three distinctive regions configured to emit light of at least two different wavelengths from above the n-type semiconductor layer opened on the opening patterns of the mask layer of the distinctive regions, forming an active layer including In and Ga on the grown light emitting structure layer, forming a p-type semiconductor layer on the light emitting structure layer, and forming an electrode configured to individually form an electrical connection with each of the at least three distinctive regions of the light emitting structure layer.

The opening patterns may include at least one of circular patterns, linear patterns, and polygonal patterns, wherein the opening patterns may include a plurality of distinctive regions being different in at least one of shapes, sizes, depths, and pattern intervals, and the plurality of distinctive regions of the light emitting structure layer may be generated based on distinctive regions of the opening patterns.

The distinctive regions may have center-to-center distances of openings in the opening patterns in the range of 50 nm to 100 μm.

Openings in the opening patterns may have diameters in the range of 50 nm to 50 μm.

The growing of the light emitting structure layer and the forming of the active layer may each be performed at a temperature ranging from 300° C. to 1200° C. and at a pressure ranging from 50 Torr to 500 Torr.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
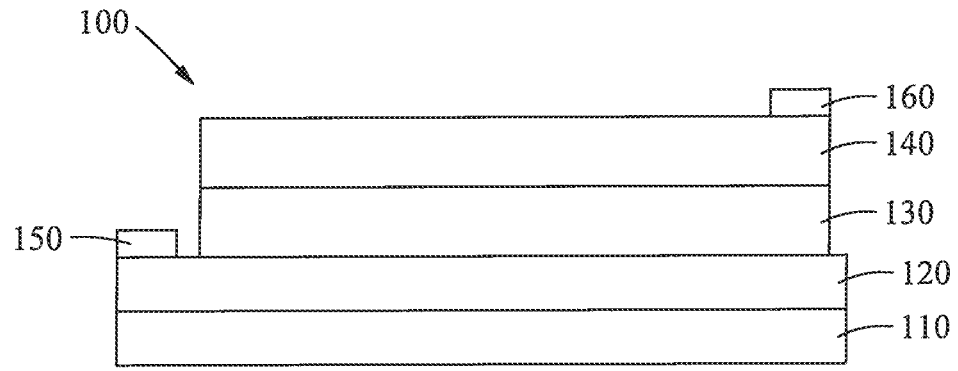
FIG. 1 illustrates a micro light emitting diode (LED) structure according to an example embodiment.

Hereinafter, example embodiments will be described in detail with reference to the accompanying drawings. Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to be limiting of the examples. As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

When describing the examples with reference to the accompanying drawings, like reference numerals refer to like constituent elements and a repeated description related thereto will be omitted. When it is determined detailed description related to a related known function or configuration they may make the purpose of the examples unnecessarily ambiguous in describing the examples, the detailed description will be omitted here.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following

One or more example embodiments relate to a micro light emitting diode (LED) structure.

The micro LED structure may include an n-type semiconductor substrate layer, a light emitting structure layer formed on the n-type semiconductor substrate layer, and a p-type semiconductor layer formed on the light emitting structure layer, wherein the light emitting structure layer may include an arrangement of light emitting structures in which active layers including In and Ga are formed on tops thereof, wherein the light emitting structure layer may form at least three distinctive regions each including a single light emitting structure or a plurality of light emitting structures, the distinctive regions configured to emit light of at least two different wavelengths, the distinctive regions may be electrically controllable to emit light individually, and the distinctive regions may be different in at least one of sizes of base faces, heights, and center-to-center distances of the lighting emitting structures of the regions.

A light emitting structure of a region configured to emit light of a relatively long wavelength may have a relatively great height.

Light emitting structures of a region configured to emit light of a relatively long wavelength has a relatively great center-to-center distance.

The distinctive regions may be different in In-migration levels in the active layers, wherein the distinctive regions may form a first region, a second region, and a third region, and the in-migration levels of the active layers on the light emitting structures of the first region, the second region, and the third region may be expressed as the first region > the second region > the third region.

The distinctive regions may be different in Ga to In average concentration ratios in the active layers, and a region configured to emit light of a relatively long wavelength may have a relatively great In to Ga average concentration ratio.

The micro LED structure will be described further with reference to FIGS. 1 through 4. FIG. 1 illustrates a micro LED structure according to an example embodiment. Referring to FIG. 1, a micro LED structure 100 may include a bottom substrate 110, an n-type semiconductor substrate layer 120, a light emitting structure layer 130, and a p-type semiconductor layer 140.

The bottom substrate 110 may be applicable to a micro LED structure and appropriately selected depending on a field of application of the micro LED structure, and may include, for example, at least one of sapphire ($Al_2O_3$), Si, SiC, GaN, and AlN.

The n-type semiconductor substrate layer 120 may be formed on the bottom substrate 110 and include an n-type gallium nitride semiconductor. For example, the n-type nitride semiconductor may include at least one of CaN, GaNP, GaNAs, GaNSb, AlGaN, BAlGaN, GaAlNP, GaAlNAs, InAlGaN, GaAlNSb, GaAlNP, GaInNAs, and GaInNSb.

The n-type semiconductor substrate layer 120 may further include an n-type impurity element, for example, N, P, As, Ge, Si, Cu, Ag, Au, Sb, or Bi.

The n-type semiconductor substrate layer 120 may be formed in a thickness ranging from 1 micrometers ($\mu m$) to 10 $\mu m$, preferably, from 2 $\mu m$ to 4 $\mu m$. If the thickness of the n-type semiconductor substrate layer 120 is less than 1 $\mu m$, the quality of the micro LED structure may not be sufficiently good. If the thickness of the n-type semiconductor substrate layer 120 is greater than 10 $\mu m$, the semiconductor substrate layer may crack.

The n-type semiconductor substrate layer 120 may have a small area or a great area, for example, a great area of at least 2 inches, at least 5 inches, or at least 12 inches.

A dielectric layer 121 (not shown) may be further formed on at least a portion of the n-type semiconductor substrate layer 120. The dielectric layer 121 may be formed on a remaining portion excluding a portion in which a light emitting structure 131 is formed on the n-type semiconductor substrate layer 120. For example, the dielectric layer 121 may include at least one of $Al_2O_3$, $TiO_2$, TiN, SiCx, SiOx, SixNy, and SiOxNy. The dielectric layer 121 may be formed in a thickness ranging from 10 nanometers (nm) to 2 $\mu m$, preferably, from 30 nm to 1 $\mu m$.

The light emitting structure layer 130 may emit light of a single wavelength band or various wavelength bands and include the same light emitting structure 131 or a plurality of different light emitting structures 131. The plurality of light emitting structures 131 may be different in structure shapes, sizes (for example, heights, volumes, cross sectional areas, diameters, lengths, and lengths of base faces), components, arrangement manners (for example, pattern intervals, arrangement shapes, and densities), components, growing schemes, and crystal structures. By changing at least one of such factors, a wavelength of light emitted from the light emitting structure 131 may be adjusted.

The light emitting structure 131 may have a diameter (or a length of a base face) ranging from 50 nm to 300 $\mu m$ and/or a height (or a length) ranging from 50 nm to 300 $\mu m$. For example, the light emitting structure may be formed in a height ranging from 50 nm to 100 $\mu m$.

A wavelength of light emitted from the light emitting structure may be controlled by various variables. Such variables may include, for example, a size and shape of the light emitting structure, a center-to-center distance, a thickness of an active layer, molar concentrations of In and Ga, and an In-migration level. For example, when a portion of the variables is controlled, a light emitting structure 131 having a relatively great height may emit light of a relatively long wavelength.

The light emitting structures 131 may be arranged to have a center-to-center distance ranging from 50 nm to 500 $\mu m$. For example, the light emitting structures may be formed to have a center-to-center distance ranging from 50 nm to 100 $\mu m$. In this example, the center-to-center distance of the light emitting structures may be at a level corresponding to an interval between patterns formed on a mask layer.

Figure 2A:
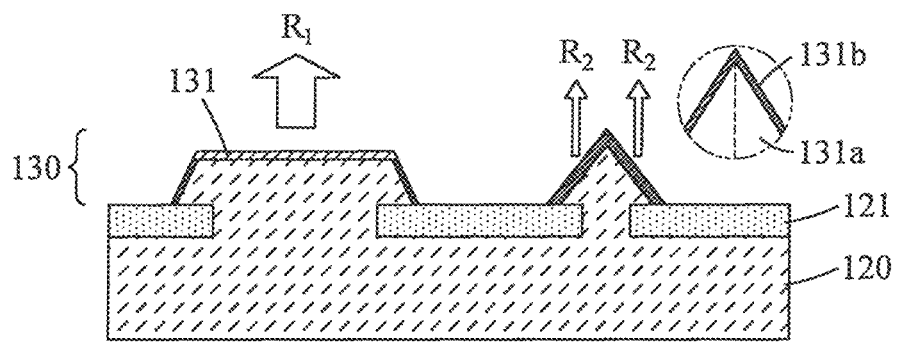
FIGS. 2A and 2B illustrate light emitting structures of a micro LED structure according to an example embodiment.
Figure 2B:
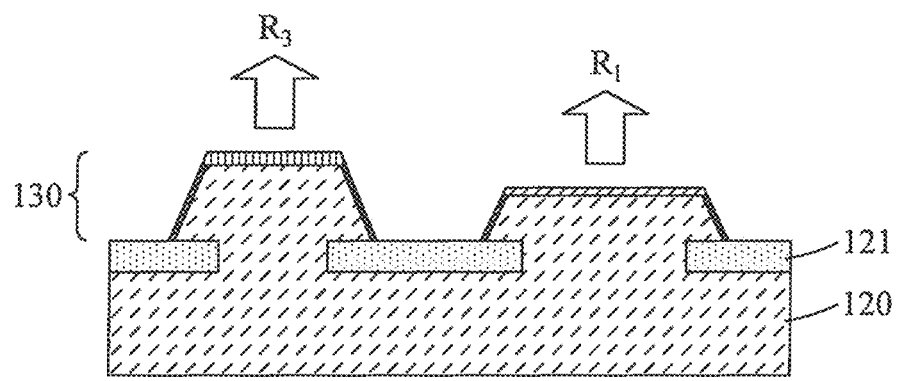

FIGS. 2A and 2B illustrate the light emitting structures 131 according to an example embodiment. Referring to FIGS. 2A and 2B, a light emitting structure 131 may include a three-dimensional (3D) structure 131a grown on the n-type semiconductor substrate layer 120 and an active layer 131b formed on at least a portion of the 3D structure 131a.

The 3D structure 131a may include an n-type semiconductor which is the same as the n-type semiconductor substrate layer 120. The 3D structure 131a may be grown on the n-type semiconductor substrate layer. The 3D structure 131a may include at least one of a cone, a polygonal pyramid, a cylinder, a polygonal prism, a circular ring, a polygonal ring, a hemisphere, a cone, a polygonal pyramid, a circular ring, and a polygonal ring truncated to have flat tops, a cone, a polygonal pyramid, and a polygonal prism including cylindrical hollows, and a line-shape wall.

For example, the 3D structure 131a may have a diameter (or a length of a base face) ranging from 50 nm to 300 $\mu m$ and/or a height (or a length) ranging from 50 nm to 300 $\mu m$.

FIGS. 2A and 2B also illustrate wavelengths of light emitted from the light emitting structure 131s according to an example embodiment. FIG. 2A illustrates an example in which the light emitting structure 131 emits light of different wavelengths R1 and R2 through different faces, wherein, for example, green light $R_1$ may be emitted through a top face of a truncated hexagonal pyramid structure, and blue light $R_2$ may be emitted through side faces of a hexagonal pyramid structure. Further, FIG. 2B illustrates an example in which structures having different heights emit light of different wavelengths, wherein truncated hexagonal pyramid structures having different heights may emit green light $R_1$ and red light $R_3$ through top faces thereof, respectively.

The active layer 131b may include a light emitting substance and be formed of a single layer or a plurality of layers. The active layer 131b may adjust a wavelength of light to be emitted by adjusting a thickness of the active layer 131b, a growth rate, a concentration ratio and migration of constituents, and a number of layers. In detail, the active layer 131b may adjust wavelengths of light to be emitted through faces of the 3D structure 131a, for example, side faces (or inclined faces) and a top face by changing at least one of the thickness of the active layer, the growth rate, the concentration ratio and migration of the constituents, and the number of layers.

The active layer 131b may change the growth rate based on a growth temperature of the active layer on the 3D structure 131a to adjust the wavelengths of light to be emitted. A plurality of active layers 131b may include active layers having the same growth rate or different growth rates. A growth rate of an active layer, that is, a thickness of the active layer, may be a factor which changes a wavelength of light to be emitted.

The active layer 131b may adjust an In-migration level in the active layer when the active layer is being grown on the 3D structure 131a, to adjust the wavelengths of light to be emitted. The In-migration level may vary depending on faces of the 3D structure 131a, for example, side faces (or inclined surfaces) or a top surface, whereby the wavelengths of light to be emitted may be adjusted. The In-migration level may vary depending on a size or a volume of the 3D structure 131a, whereby the wavelengths of light to be emitted may be adjusted. The In-migration level may vary depending on an arrangement interval of the 3D structure 131a, whereby the wavelengths of light to be emitted may be adjusted. The In-migration level may vary depending on a process condition for growing the active layer, whereby the wavelengths of light to be emitted may be adjusted. The above examples will be described further in relation to a manufacturing method. The plurality of active layers 131b may include active layers having the same In-migration level or different In-migration levels. An In-migration may be caused by a difference in relative movement easiness between indium and gallium. The In-migration is a phenomenon occurring since indium moves longer than gallium on the mask layer. By the In-migration, a molar concentration of In in an active layer of the light emitting structure may increase as an area in which amount of indium reached by migration increases when the active layer is being grown. In this example, the molar concentration of In may be a factor which determines the wavelengths of light to be emitted.

The active layer 131b may adjust a Ga to In average concentration ratio in the active layer when the active layer is being, grown on the 3D structure 131a, to adjust the wavelengths of light to be emitted. The plurality of active layers 131b nay include active layers having the same Ga to In average concentration ratio or different Ga to In average concentration ratios. Average concentration ratios of In and Ga may be adjusted through amounts of In and Ga to be injected and also be adjusted by controlling the In-migration level through an interval design between light emitting structures.

The active layer 131b may include at least one of BAlGaN, GaAlNP, GaAlNAs, InAlGaN, GaAlNSb, GaInNP, GaInNAs, and GaInNSb, preferably, InGaN.

The active layer 131b may further include a super lattice layer, and emission of light of a long wavelength may be induced by inserting the super lattice layer. The super lattice layer may be formed in a thickness ranging from 1 nm to 10 nm. The super lattice layer may be formed of a single layer or a plurality of layers and include a quantum well layer.

For example, the light emitting structures 131 may be arranged at random or regularly. The light emitting structures 131 may be arranged in a pattern of at least one of a circle, an oval, a polygon, a circle, an oval and a polygon with a central point, and a line. The circle, the oval and the polygon with the central point may be a shape in which a single central point is surrounded by a single circle, oval or polygon or a plurality of circles, ovals or polygons.

Figure 3A:
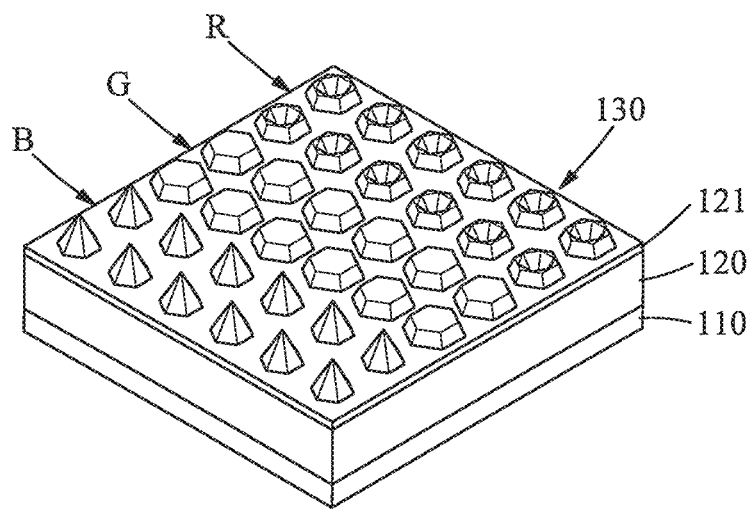
FIGS. 3A and 3B illustrate light emitting structures of a micro LED structure according to an example embodiment.
Figure 3B:
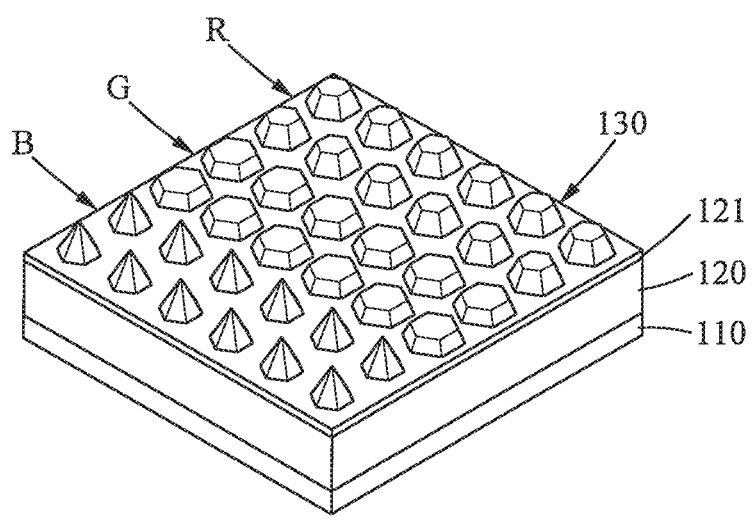

FIGS. 3A and 3B illustrate light emitting structures of a micro LED structure according to an example embodiment. Referring to FIGS. 3A and 3B, the light emitting structure layer 130 may be partitioned into a plurality of regions, and the light emitting structures 131 may be arranged in the regions.

The light emitting structures 131 may be arranged on the light emitting structure layer 130 such that a single light emitting region or a plurality of light emitting regions may be formed, and the light emitting structure layer 130 may be partitioned based on wavelengths of light to be emitted. For example, at least three distinctive regions including a first region R configured to emit red light, a second region G configured to emit green light, and a third region B configured to emit blue light may be formed.

The distinctive regions may include the same light emitting structure 131 or different light emitting structures 131 to adjust the wavelengths of light to be emitted.

The distinctive regions may be different in at least one of shapes of the light emitting structures 131, sizes (for example, heights, volumes, cross sectional areas, diameters, lengths, and lengths of base faces), pattern intervals (for example, center-to-center distances of the light emitting structures), arrangement shapes, densities (for example, ratios of volumes of the light emitting structures 131 to areas of the distinctive regions), components, growth schemes, crystal structures, and configurations of the active layers (thicknesses, In-migrations, and Ga to In average concentrations of the active layers).

In detail, the distinctive regions may be different in the center-to-center distances of the light emitting structures and/or the ratios of the volumes of the light emitting structures to the areas of the distinctive regions. Light emitting structures of a region configured to emit light of a relatively long wavelength may have a relatively great center-to-center distance, and a light emitting structure of a region configured to emit light of a relatively long wavelength may have a relatively great height.

The above effects may be achieved by controlling a portion of a plurality of factors which change the wavelengths of light to be emitted. When a portion of the factors is controlled, light of a relatively long wavelength may be emitted as the height of the light emitting structure increases, which is implemented since an In-migration length is relatively long.

Meanwhile, the distinctive regions may include the same active layer 131b or different active layers 131b. The distinctive regions may be different in In-migration levels in the active layers. When assuming the distinctive regions include the first region through the third region, the In-migration levels in the active layers on the light emitting structures of the first region, the second region, and the third region may be expressed as the first region > the second region > the third region, based on the premise that a portion of the factors is controlled. For example, the first region through the third region may be regions configured to emit red, green, and blue lights.

The distinctive regions may be different in Ga to In average concentrations in the active layers, and a region configured to emit light of a relatively long wavelength may have a relatively great In to Ga average concentration ratio.

The distinctive regions may be different in thicknesses of the active layers.

The distinctive regions may include light emitting structures 130 of different shapes. In the example of FIG. 3A, the first region R configured to emit red light may include hexagonal pyramid structures including cylindrical hollows, the second region G configured to emit green light may include truncated hexagonal pyramid structures, and the third region B configured to emit blue light may include pyramid structures. In an example of FIG. 3B, the first region R configured to emit red light may include truncated hexagonal pyramid structures, the second region G configured to emit green light may include truncated hexagonal pyramid structures, and the third region B configured to emit blue light may include hexagonal pyramid structures. The truncated hexagonal pyramid structures, the hexagonal pyramid structures, and the hexagonal pyramid structures including the cylindrical hollows may have the same height or different heights.

The first region R configured to emit red light, the second region G configured to emit green light, and the third region B configured to emit blue light may include hexagonal pyramid structures or truncated hexagonal pyramid structures, and the third region B configured to emit blue light may use a wavelength of light emitted through side faces of the hexagonal pyramid structures, and the second region G configured to emit green light and the first region R configured to emit red light may use wavelengths of light emitted through at least one of side faces and top faces of the truncated hexagonal pyramid structures. That is, the second region G configured to emit green light and the first region R configured to emit red light may be determined based on the heights of the top faces of the truncated hexagonal pyramid structures, and light of a relatively long wavelength may be emitted through a top face of a truncated hexagonal pyramid structure with a relatively great height.

Figure 4:
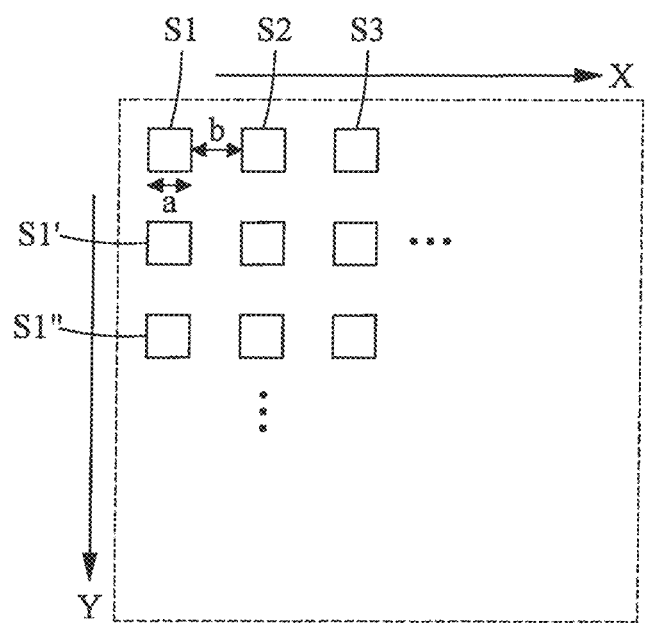
FIG. 4 illustrates an arrangement of distinctive regions of a micro LED structure according to an example embodiment.

The distinctive regions may be arranged regularly or at random. FIG. 4 illustrates an arrangement of distinctive regions of a micro LED structure according to an example embodiment. Referring to FIG. 4, distinctive regions S1, S2, S3, . . . , Sn may be arranged in a direction of X and distinctive regions S1', S1'', S2', S2'', . . . , Sn''' may be arranged in a direction of Y. Sn and Sn''' may be red, green, or blue light emitting regions, and the light emitting regions may be arranged at the same center-to-center distance or different center-to-center distances b of light emitting structures therein. The center-to-center distance b of the light emitting structures may be in the range of 50 nm to 500 μm. In addition, the light emitting regions arranged in the direction of X and the direction of Y may include the same light emitting structure or different light emitting structures, as described above, and the light emitting structures may adjust wavelengths of light to be emitted based on a desired arrangement of the light emitting regions. For example, the plurality of light emitting regions may form pixel units including red, green, and blue light emitting regions as subpixels. The light emitting regions may provide light sources of colors desired by a display in the unit of subpixels and implement a color or full color micro display.

The distinctive regions may have at least one of shapes of circles (or dots) and polygons (for example, triangles, squares, rectangles, or hexagons) and have widths a of at least 5 μm, at least 10 μm, or at least 15 μm.

The p-type semiconductor layer 140 may be formed on the light emitting structure layer 130. The p-type semiconductor layer 140 may include a p-type gallium nitride semiconductor. For example, the p-type gallium nitride semiconductor may include at least one of GaN, GaNP, GaNAs, GaNSb, AlGaN, InGaN, BAlGaN, GaAlNP, GaAlNAs, InAlGaN, GaAlNSb, GaInNP, GaInNAs, and GaInNSb, preferably, a p-type GaN including an AlGaN electron blocking layer. Further, the p-type semiconductor layer 140 may further include a p-type impurity element, for example, Mg, B, In, Ga, Al, or Tl.

The distinctive regions may be individually connected to an electrode. That is, when assuming that the distinctive regions emit red, green, and blue lights, the micro LED structure may operate to selectively emit only one or two of the red, green, and blue lights. Thus, in an example of using the micro LED structure provided herein, a full color display implemented in a combination of various colors may be implemented, in addition to a display emitting white light by simply mixing red, green, and blue lights.

For example, the micro LED structure 100 may further include, for an operation, an n-type metal electrode layer 150 and a p-type metal electrode layer 160. The distinctive regions in the micro LED structure 100 may operate by being individually connected to the n-type metal electrode layer 150 and the p-type metal electrode layer 160 and be controllable to emit light individually.

A region of a relatively long wavelength may have a relatively great average thickness of the active layers.

The light emitting structures of the distinctive regions may be different in at least one of heights, shapes, and areas and be all grown concurrently through a one-step process.

The active layers may further include super lattice layers.

Meanwhile, the n-type metal electrode layer 150 may be formed on at least a portion of the n-type semiconductor substrate layer 120. The n-type metal electrode layer 150 may include at least one of Co, Ir, Ta, Cr, Mn, Mo, W, Re, Fe, Sc, Ti, Sn, Ge, Sb, Al, Pt, Ni, Au, ITO, and ZnO. The n-type metal electrode layer 150 may be formed of a single layer or a plurality of layers.

Further, the p-type metal electrode layer 160 may be formed on at least a portion of the p-type semiconductor layer 140. The p-type metal electrode layer 160 may include at least one of Co, Ir, Ta, Cr, Mn, Mo, W, Re, Fe, Se, Ti, Sn, Ge, Sb, Al, Pt, Ni, Au, ITO, and ZnO. The p-type metal electrode layer 160 may be formed of a single layer or a plurality of layers.

The n-type metal electrode layer 150 and the p-type metal electrode layer 160 may act as ohmic electrons and electrically operate by providing currents to the micro LED structure 100, and be formed in thicknesses ranging from 30 nm to 500 nm, preferably, from 50 nm to 300 nm.

One or more example embodiments relate to a micro display including a micro LED structure. The micro LED structure is applied to the micro display, and thus a manufacturing process and cost may be reduced, and a color display may be implemented.

The micro display may use a light emitting structure grown on an n-type semiconductor substrate layer, and thus sizes of pixels and/or subpixels, an arrangement, and a color of light may be adjusted precisely, and a full color display may be implemented.

The subpixels may include subpixels of red, green, and blue light emitting regions. The subpixels may be arranged regularly or at random. That is, the light emitting regions S1, ..., Sn and S1', ..., Sn''' of FIG. 4 may be configured as the subpixels. The sizes of the subpixels of the red, green, and blue light emitting regions may include widths a of at least 5 µm, at least 10 µm, or at least 15 µm. The red, green, and blue light emitting regions may have shapes of at least one of circles (or dots) and polygons (for example, triangles, squares, rectangles, or hexagons).

One or more example embodiments relate to a method for manufacturing a micro LED structure. The manufacturing method may form a light emitting structure layer having various light emitting regions on a single substrate using a one-step growth process, and further simplify a process of manufacturing a micro LED display.

One or more example embodiments relate to a method for manufacturing a micro LED, the method including forming an n-type semiconductor layer on a bottom substrate, forming a mask layer on the n-type semiconductor layer, patterning the mask layer to form at least three distinctive regions each including a single opening pattern or a plurality of opening patterns, the distinctive regions being different in at least one of center-to-center distances and sizes of the opening patterns, growing a light emitting structure layer including at least three distinctive regions configured to emit light of at least two different wavelengths from above the n-type semiconductor layer opened on the opening patterns of the mask layer of the distinctive regions, forming an active layer including In and Ga on the grown light emitting structure layer, forming a p-type semiconductor layer on the light emitting structure layer, and forming an electrode configured to individually form an electrical connection with each of the at least three distinctive regions of the light emitting structure layer.

The opening patterns may include at least one of circular patterns, linear patterns, and polygonal patterns, wherein the opening patterns may include a plurality of distinctive regions being different in at least one of shapes, sizes, depths, and pattern intervals, and the plurality of distinctive regions of the light emitting structure layer may be generated based on distinctive regions of the opening patterns.

The distinctive regions may have center-to-center distances of openings in the opening patterns in the range of 50 nm to 100 µm.

Openings in the opening patterns may have diameters in the range of 50 nm to 50 µm.

The growing of the light emitting structure layer and the forming of the active layer may each be performed at a temperature ranging from 300° C. to 1200° C. and at a pressure ranging from 50 Torr to 500 Torr.

Figure 5:
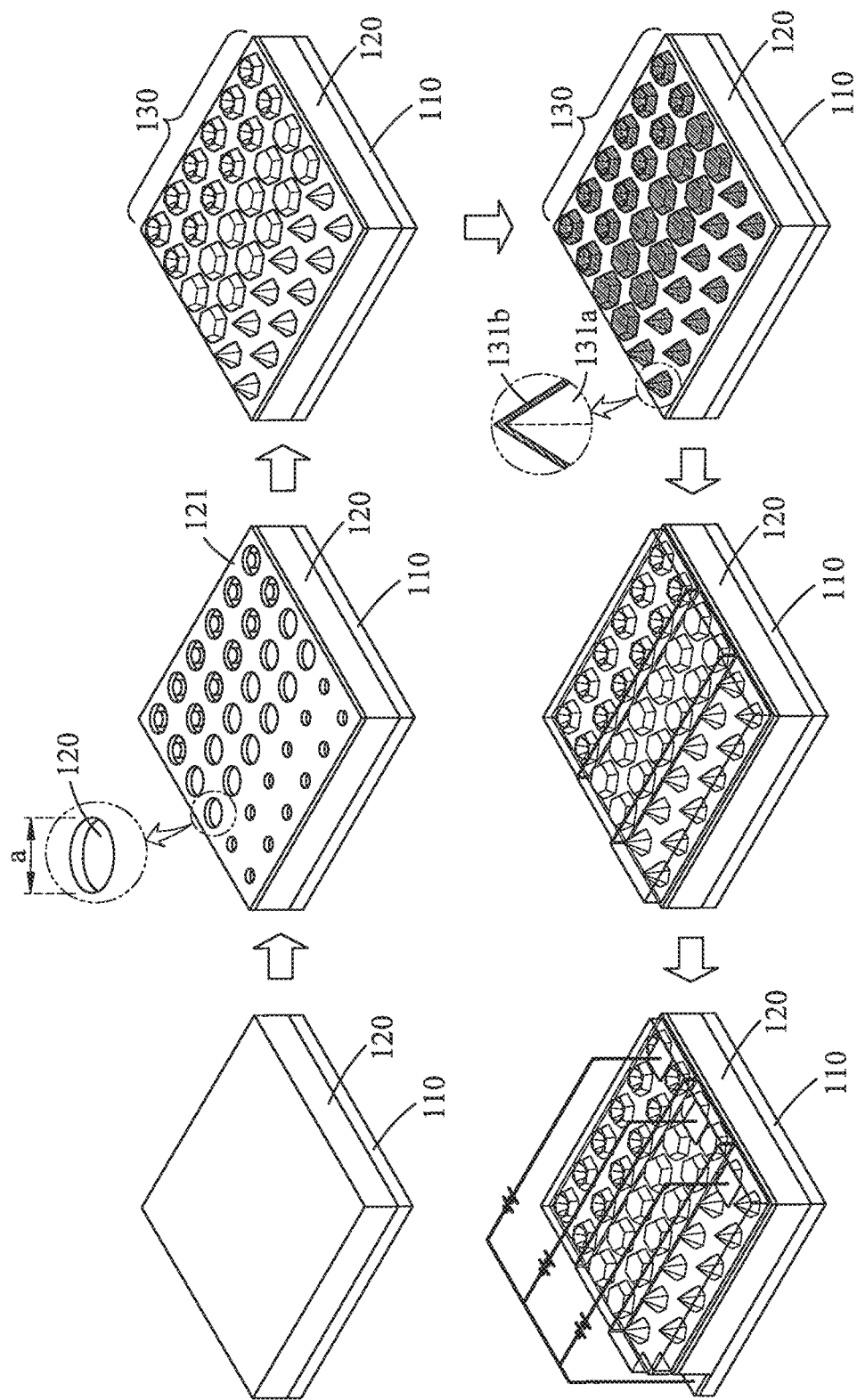
FIG. 5 illustrates a process of a method for manufacturing a micro LED according to an example embodiment.

The above manufacturing method will be described further with reference to FIG. 5. FIG. 5 illustrates a process of a method for manufacturing a micro LED according to an example embodiment. Referring to FIG. 5, the manufacturing method may include operation S110 of preparing a bottom substrate, operation S120 of forming an n-type semiconductor layer, operation S130 of forming a mask layer, operation S140 of patterning and forming a light emitting structure layer, and operation S150 of forming a p-type semiconductor layer. The manufacturing method may further include operation S160 of forming an electrode after operation S150.

In operation S110, the bottom substrate 110 may be prepared.

In operation S120, the n-type semiconductor substrate layer 120 may be formed on at least a portion of the bottom substrate 110 using metal-organic chemical vapor deposition (MOCVD), molecular beam epitaxy (MBE), or hydride vapor phase epitaxy (HVPE). A process condition is not particularly limited. The n-type semiconductor substrate layer 120 is as described above.

In operation S130, the mask layer 121 may be deposited on at least a portion of the n-type semiconductor substrate layer 120. For example, the mask layer 121 may have a thickness ranging from 10 nm to 200 nm and include components the same as those of the dielectric layers described above.

In operation S140, the mask layer 121 may be patterned with opening patterns. The opening patterns may be formed on a single substrate using a one-step process. Thus, the micro LED structure may be formed without performing a transferring process, and a relatively great-area substrate may be applicable.

In operation S140, a plurality of opening patterns may be formed on the mask layer to form the distinctive regions described above, and the mask layer may be patterned to form at least three distinctive regions being different in at least one of pattern intervals and shapes. The mask layer may be patterned by being partitioned into subpixels including red, green, and blue light emitting regions, and light sources necessary for the display may be provided on the single substrate using a one-step process.

The shapes and sizes of the light emitting structures 130, and the configuration of the active layers may be adjusted based on the sizes a of the opening patterns and arrangement intervals of the opening patterns, and the wavelengths of light emitted from the light emitting structures 130 may be adjusted minutely.

Figure 6A:
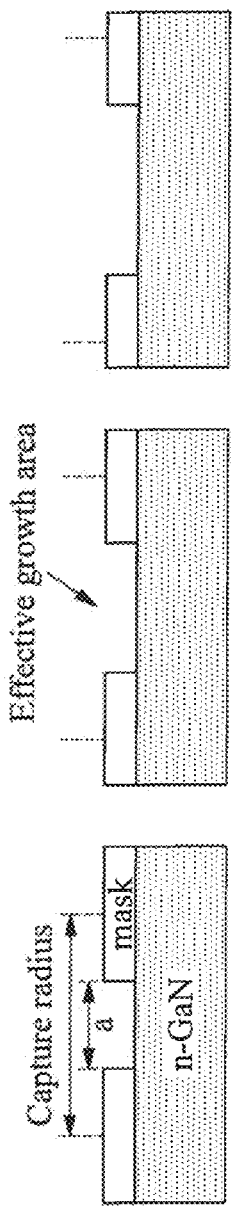
FIGS. 6A and 6B illustrate light emitting structures grown based on sizes of opening patterns according to an example embodiment.
Figure 6B:
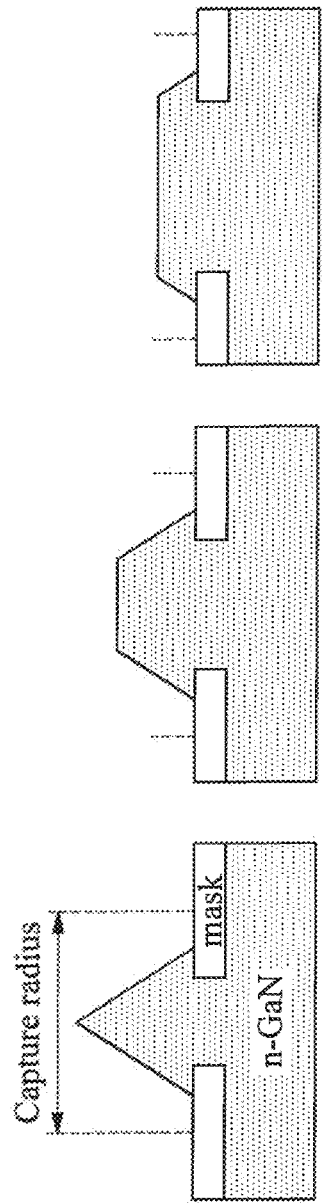

FIGS. 6A and 6B illustrate light emitting structures grown based on sizes of opening patterns according to an example embodiment. Referring to FIG. 6A, a growth region and a capture radius may be determined based on a size of an opening pattern. Referring to FIG. 6B, structures may be grown in various shapes based on growth regions and capture radiuses. Such growth regions and capture radiuses may adjust the widths and heights of the grown structures, and further be utilized to adjust the configuration of the active layers after the structures are grown.

Figure 7:
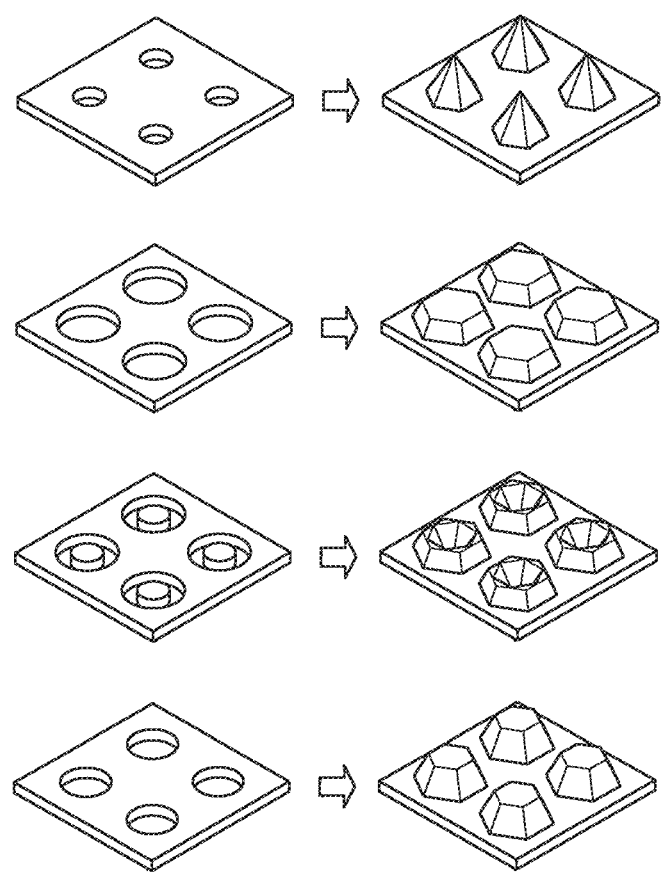
FIG. 7 illustrates light emitting structures grown based on sizes and shapes of opening patterns according to an example embodiment.

FIG. 7 illustrates light emitting structures grown based on sizes and shapes of opening patterns according to an example embodiment. Referring to FIG. 7, pyramid structures, truncated pyramid structures, and pyramid structures including cylindrical hollows may be formed based on the sizes and shapes of the opening patterns.

Figure 8:
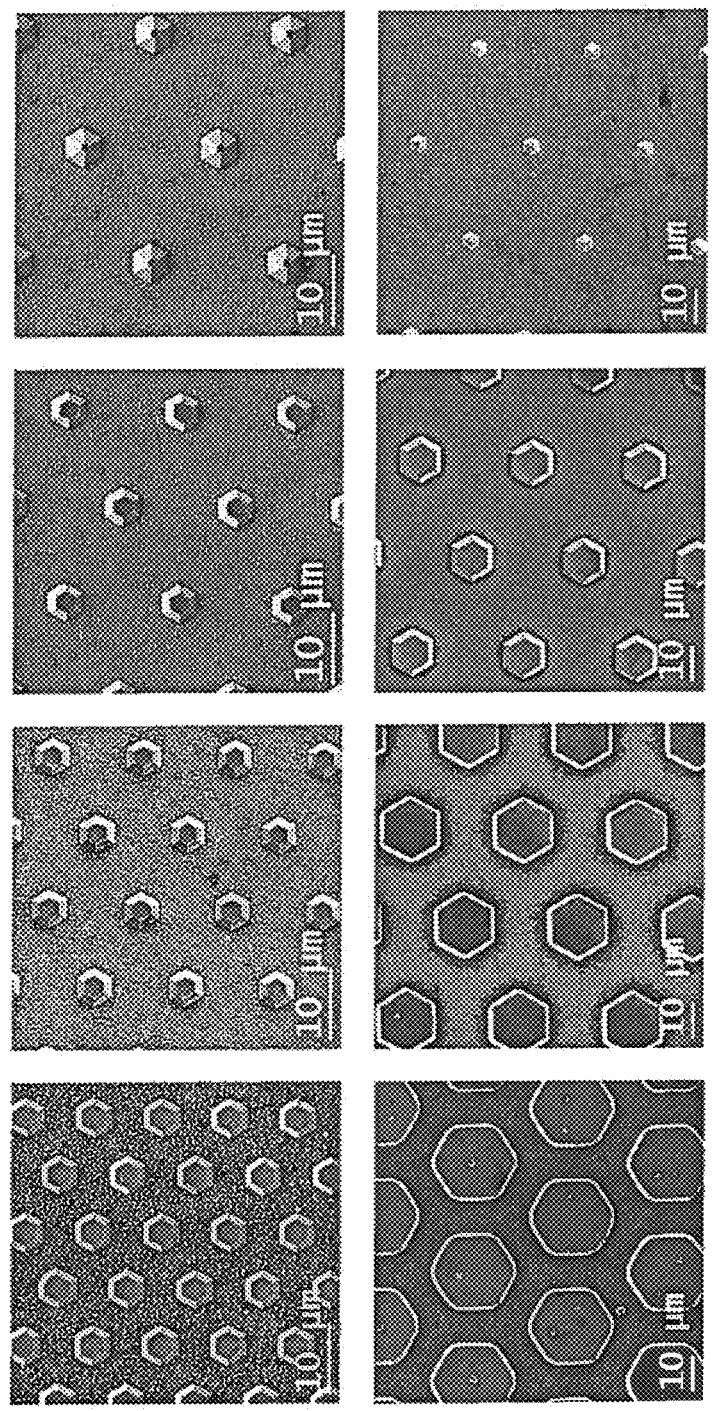
FIG. 8 illustrates scanning electron microscopy (SEM) images of light emitting structures grown based on sizes and center-to-center distances of opening patterns according to an example embodiment.

FIG. 8 illustrates scanning electron microscopy (SEM) images of light emitting structures grown based on sizes and center-to-center distances of opening patterns according to an example embodiment. Referring to FIG. 8, formation of pyramid structures and truncated pyramid structures may be adjusted based on the sizes and center-to-center distances of the opening patterns.

Figure 9A:
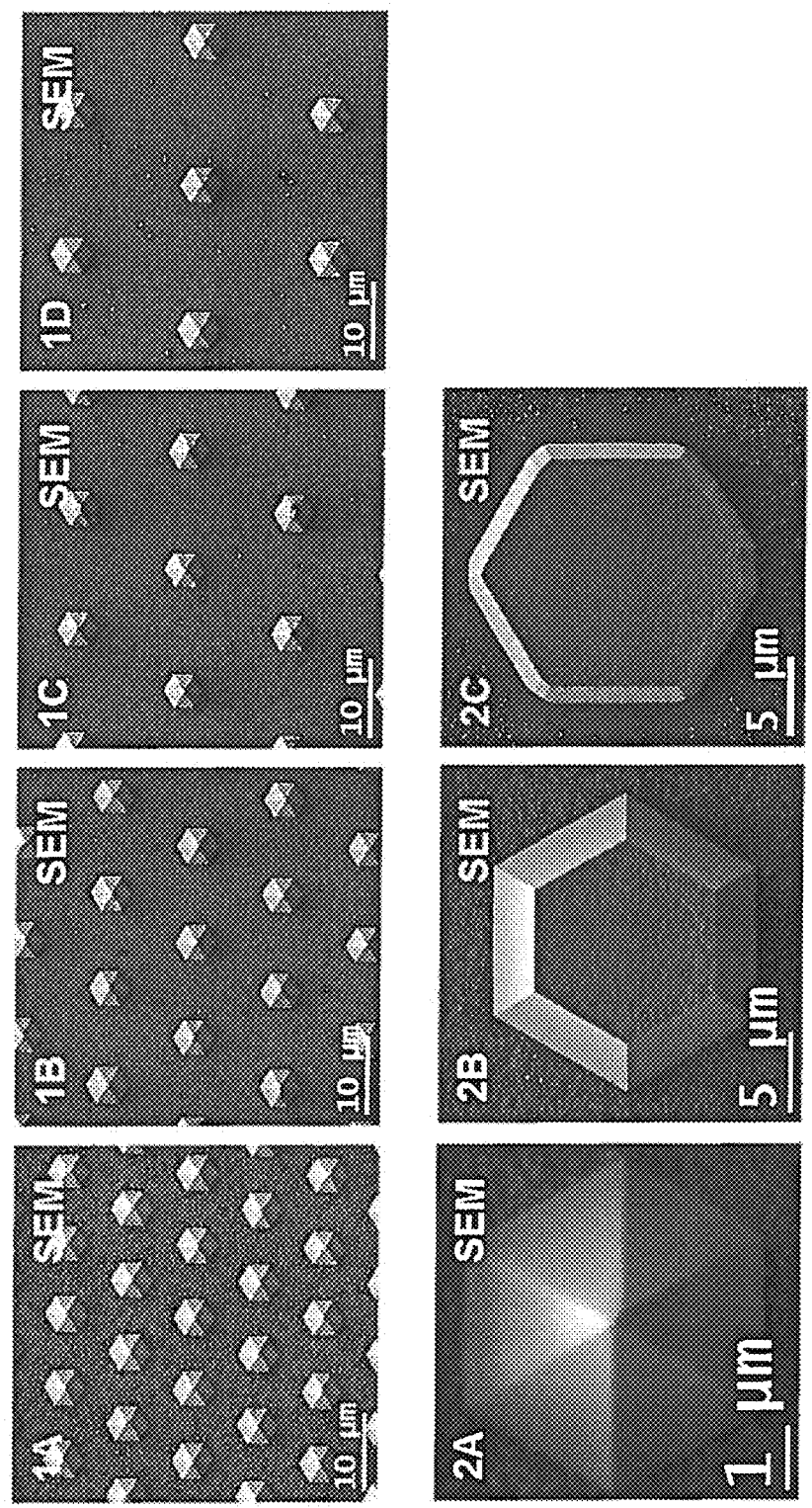
FIGS. 9A and 9B illustrate light emitting structures grown based on sizes and center-to-center distances of opening patterns and a change in wavelength of light according to an example embodiment.
Figure 9B:
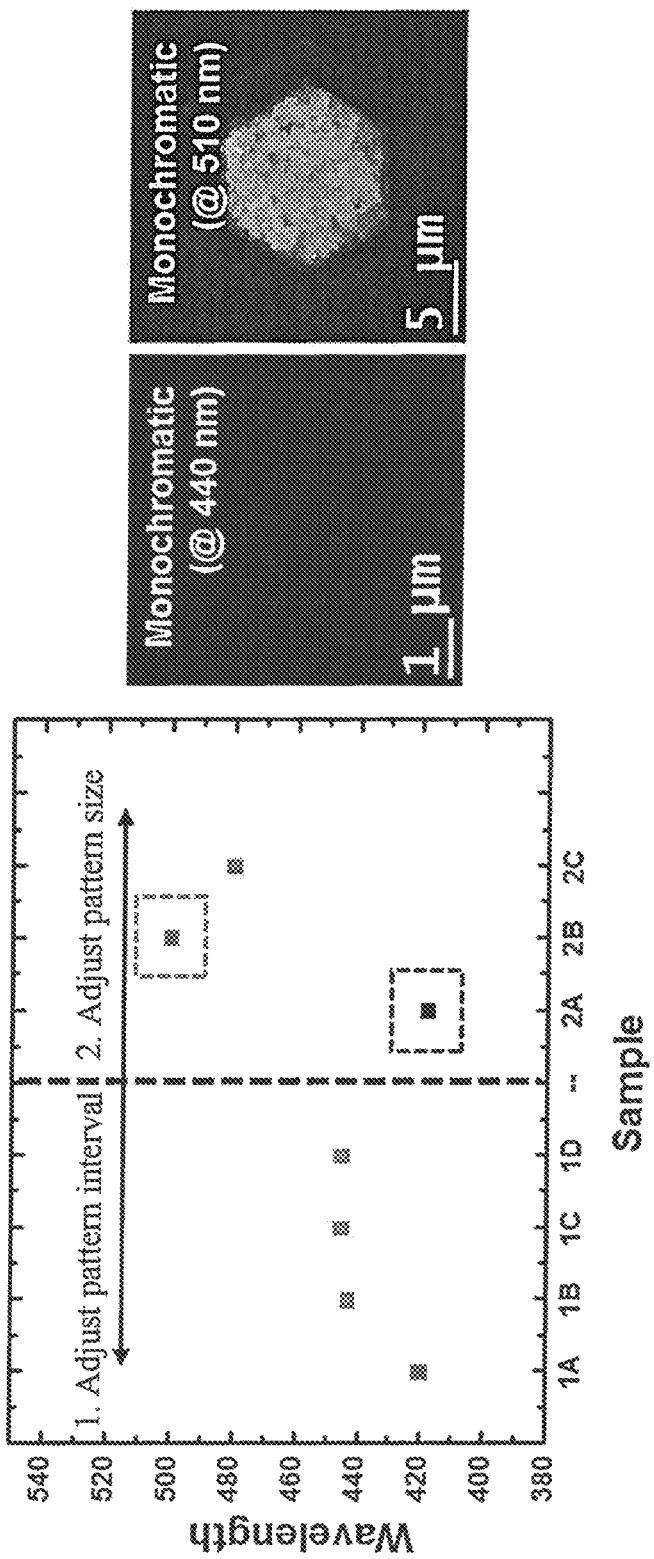

FIGS. 9A and 9B illustrate light emitting structures grown based on sizes and center-to-center distances of opening patterns and a change in wavelength of light according to an example embodiment. The example of FIG. 9A verifies that the shapes and sizes of the light emitting structures may vary based on the sizes and center-to-center distances of the opening patterns, and the example of FIG. 9B verifies that the wavelengths of light emitted from the light emitting structures may vary. That is, the wavelengths of light to be emitted may be adjusted minutely based on the configuration of the opening patterns. Further, referring to FIG. 9B, the pyramid structures and the truncated pyramid structures may be formed, and the sizes and the heights of the truncated pyramid structures may change as the sizes of the opening patterns increase. That is, it may be verified that the shapes and heights of the structures may be adjusted based on the sizes of the opening patterns.

In operation S140, patterning may be performed using a lithography process, reactive ion etching, and wet etching. For example, the lithography process may use photo-lithography, laser lithography, e-beam lithography, or nano-lithography.

The diameters a (or widths) of the opening patterns may be appropriately selected based on the shapes of the light emitting structures, preferably, in the range of 50 nm to 50 µm. The arrangement intervals of the opening patterns may be greater than the diameters. Cross sections of the opening patterns may have shapes of at least one of circles and polygons, and the n-type semiconductor substrate layer 120 may be opened at lower end portions of the opening patterns. The center-to-center distances of openings in the opening patterns may be in the range of 50 nm to 100 µm.

The opening patterns may include at least one of circular patterns, linear patterns, and polygonal patterns, wherein the opening patterns may include a plurality of distinctive regions being different in at least one of shapes, sizes, depths, and pattern intervals, and the plurality of distinctive regions of the light emitting structure layer may be generated based on distinctive regions of the opening patterns. For example, at least three light emitting structure regions configured to emit light of at least two different wavelengths, the light emitting structure regions represented by the first region and the third region, may be formed by the various opening patterns.

Operation S140 may include an operation of growing the 3D structure 131a and an operation of forming the active layer 131b.

In operation S140, the light emitting structure layer 130 may be formed all over the substrate according to the opening patterns using a one-step process, wherein the light emitting structure layer including at least three distinctive regions configured to emit red, green, and blue lights from above the n-type semiconductor layer opened on the opening patterns of the mask layer of the distinctive regions may be grown. Thus, various light emitting regions may be formed on the single substrate without performing a transferring process, and light sources necessary for a display may be manufactured using a one-step process.

In the operation of growing the 3D structure 131a, the 3D structure 131a may be grown on the n-type semiconductor layer opened in the opening patterns.

In operation of growing the 3D structure 131a, the heights and/or shapes of the structures may be adjusted based on a growth time. For example, by increasing the growth time, the truncated pyramid structures may be grown to pyramid structures. In another example in which the same growth time is provided, the structures may be designed based on the sizes and center-to-center distances of the opening patterns mentioned above. For example, pyramid structures may be formed by circular patterns with a relatively great center-to-center distance or relatively small circular patterns, and truncated pyramid structures may be formed by circular patterns with a relatively short center-to-center distance or relatively great circular patterns. In addition, as the sizes of the patterns decrease, the heights of the truncated pyramid structures may increase.

The operation of growing the 3D structure 131a may be performed at a temperature ranging from 700° C. to 1200° C. and at a pressure ranging from 50 Torr to 500 Torr. The above operation may be performed using MOCVD, MBE, or HYPE.

In the operation of growing the 3D structure 131a, the 3D structure 131a may be formed of components the same as or different from those of the n-type semiconductor substrate layer 120, and the shapes of the 3D structure may be as described above.

In the operation of forming the active layer, the active layer 131b may be formed on at least a portion of the 3D structure 131a. As described above, the configuration of the active layer may be adjusted. For example, the active layer including In and Ga may be formed on the grown light emitting structure layer.

The operation of forming the active layer may be performed at a temperature ranging from 550° C. to 850° C., and the range of temperature may be appropriately selected based on a desired growth rate of the active layer. The operation of forming the active layer may be performed using MOCVD, MBE, or HVPE. The components and configuration of the active layer may be as described above.

By applying differences in growth rate and content of the components when the active layer is being formed, wavelengths of light to be emitted may be adjusted. For example, wavelengths of light emitted from hexagonal pyramid structures and truncated hexagonal pyramid structures may be adjusted based on differences in growth rate and indium content of InGaN layers formed on a crystal plane of a c-axial direction and a semi-polar crystal plane when an InGaN active layer is being formed.

Figure 10:
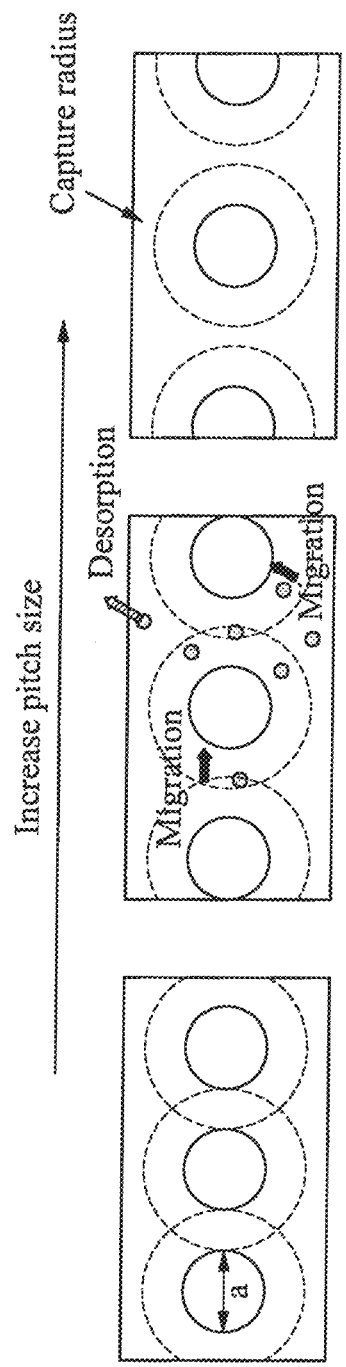
FIG. 10 illustrates an example of adjusting a migration length of an element based on sizes and center-to-center distances of opening patterns according to an example embodiment.

Wavelengths of light to be emitted may be adjusted based on a difference in migration length of component elements when the active layer is being formed. For example, light emitting regions may be set based on the heights of the truncated hexagonal pyramid structures and a difference in migration length between indium and gallium. That is, the migration lengths of the component elements may be adjusted based on the sizes and center-to-center distances of the opening patterns. In detail, FIG. 10 illustrates an example of adjusting a migration length of an element based on sizes and center-to-center distances of opening patterns according to an example embodiment. Referring to FIG. 10, an overlap of capture radiuses may decrease as the center-to-center distances increase, which may affect the migration length of the element when an active layer is being formed. This may adjust an In-migration level of the active layer. Further, to form an effective structure configured to emit light of a relatively long wavelength, a super lattice layer may further be inserted.

In an operation of forming a p-type gallium nitride semiconductor layer, the p-type gallium nitride semiconductor layer 140 may be formed on the 3D structure layer 130 after the active layer is formed. In this example, an electrode may be formed to individually form an electrical connection with each of at least three distinctive regions of the light emitting structure layer.

The operation of forming the p-type gallium nitride semiconductor layer may be performed using MOCVD, MBE, or HVPE. The components and configuration of the p-type gallium nitride semiconductor layer 140 may be as described above.

The manufacturing method may further include an operation of forming the n-type metal electrode layer 150 on at least a portion of the n-type semiconductor substrate layer 120 and an operation of forming the p-type metal electrode layer 160 on at least a portion of the p-type gallium nitride semiconductor layer 140, and the process condition is not particularly limited.

The deposition method and the growth method suggested herein may use typical process conditions without departing from the scope of the present invention and is not particularly limited, and should also be clearly understandable by those skilled in the art from the above description.

According to example embodiments, it is possible to provide a micro LED structure in various shapes to be applicable to a display, wherein the micro LED structure may be partitioned into a plurality of distinctive regions so as to operate individually and be controllable to emit light of desired wavelengths.

The micro LED structure may emit light of various wavelengths on a single substrate using 3D light emitting structures, thereby implementing a high-quality color micro display.

According to example embodiments, it is possible to provide a micro LED structure implementing a color display by forming red, green, and blue light emitting structures on a single substrate and performing a series of processes, without applying a transferring process.

According to example embodiments, it is possible to simplify a process of manufacturing a micro LED and significantly reduce a cost for the manufacturing process, and thereby realize a commercialization of a micro LED based color micro display.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A micro light emitting diode (LED) structure, comprising:
   an n-type semiconductor substrate layer;
   a light emitting structure layer formed on the n-type semiconductor substrate layer; and
   a p-type semiconductor layer formed on the light emitting structure layer,
   wherein the light emitting structure layer includes an arrangement of light emitting structures, each one of the light emitting structures having multiple active layers, each one of the active multiple layers have a different growth rate depending on a crystal plane of a 3D structure of the light emitting structure in which the active layers including In and Ga are formed on tops thereof,
   wherein the light emitting structure layer forms at least three distinctive regions each including a single light emitting structure or a plurality of light emitting structures, the distinctive regions configured to emit light of at least two different wavelengths,
   the distinctive regions are controllable to emit light individually,
   and the distinctive regions are different in at least one of sizes of base faces, heights, and center-to-center distances of the lighting emitting structures of the regions and wherein the distinctive regions are individually connected to a p-type semiconductor layer and an electrode;
   wherein the p-type semiconductor layer is a flat layer, at least one of the distinctive regions includes the light emitting structures including at least one of a cone; a cylinder; a polygonal prism; a circular ring, a polygonal ring, a hemisphere; a cone, a polygonal pyramid, a circular ring, and a polygonal ring truncated to have flat tops; a cone, a polygonal pyramid, and a polygonal prism including cylindrical hollows; and a linear prism;
   wherein the distinctive regions are different in In-migration levels in the active layers, wherein the distinctive regions form a first region, a second region, and a third region, and the In-migration levels in the active layers on the light emitting structures of the first region, the second region, and the third region are expressed as the first region > the second region > the third region; and
   wherein the distinctive regions are different in In to Ga average concentration ratios in the active layers, and a region configured to emit light of a relatively long wavelength has a relatively great In to Ga average concentration ratio.

2. The micro LED structure of claim 1, wherein a light emitting structure of a region configured to emit light of a relatively long wavelength has a relatively great height.

3. The micro LED structure of claim 1, wherein light emitting structures of a region configured to emit light of a relatively long wavelength have a relatively great center-to-center distance.

4. The micro LED structure of claim 1, wherein a region of a relatively long wavelength has a relatively great average thickness of the active layers.

5. The micro LED structure of claim 1, wherein the light emitting structures of the distinctive regions are different in at least one of heights, shapes, and areas and are all grown concurrently through a one-step process.

6. The micro LED structure of claim 1, wherein the distinctive regions have center-to-center distances of the light emitting structures in the range of 50 nanometers (nm) to 100 micrometers (μm).

7. The micro LED structure of claim 1, wherein the distinctive regions have heights of the light emitting structures in the range of 50 nm to 50 μm.

8. The micro LED structure of claim 1, wherein the active layers further include at least one selected from the group consisting of BAlGaN, GaAlNP, GaAlNAs, InAlGaN, GaAlNSb, GaInNP, GaInNAs, and GaInNSb.

9. The micro LED structure of claim 1, wherein the active layers further include super lattice layers.

10. A color micro light emitting diode (LED) display comprising the micro LED structure of claim 1.

* * * * *